(12) United States Patent
Tang et al.

(10) Patent No.: US 12,091,756 B2
(45) Date of Patent: Sep. 17, 2024

(54) SILICON OXYCARBIDE-BASED ENVIRONMENTAL BARRIER COATING

(71) Applicant: Raytheon Technologies Corporation, Farmington, CT (US)

(72) Inventors: Xia Tang, West Hartford, CT (US); Paul Sheedy, Bolton, CT (US); Tania Bhatia Kashyap, West Hartford, CT (US); Wayde R. Schmidt, Pomfret Center, CT (US); Daniel G. Goberman, East Granby, CT (US)

(73) Assignee: RTX CORPORATION, Farmington, CT (US)

( * ) Notice: Subject to any disclaimer, the term of this patent is extended or adjusted under 35 U.S.C. 154(b) by 3 days.

(21) Appl. No.: 17/403,296

(22) Filed: Aug. 16, 2021

(65) Prior Publication Data

US 2022/0081750 A1    Mar. 17, 2022

Related U.S. Application Data

(63) Continuation of application No. 15/110,819, filed as application No. PCT/US2015/010554 on Jan. 8, 2015, now abandoned.

(Continued)

(51) Int. Cl.
*F01D 5/28* (2006.01)
*C23C 4/04* (2006.01)
(Continued)

(52) U.S. Cl.
CPC .......... *C23C 4/12* (2013.01); *C23C 4/04* (2013.01); *C23C 16/32* (2013.01); *C23C 16/401* (2013.01); *C23C 28/04* (2013.01); *F01D 5/288* (2013.01); *F16J 15/453* (2013.01); *F05D 2240/11* (2013.01); *F05D 2240/12* (2013.01);
(Continued)

(58) Field of Classification Search
None
See application file for complete search history.

(56) References Cited

U.S. PATENT DOCUMENTS 5,851,678 A * 12/1998 Hasz ................. C04B 35/01
428/689
6,607,852 B2   8/2003 Spitsberg
(Continued)

FOREIGN PATENT DOCUMENTS

| EP | 1726681 | 11/2006 |
| EP | 2415905 | 2/2012 |
| EP | 2617693 | 7/2013 |

OTHER PUBLICATIONS

The International Search Report and Written Opinion for PCT Application No. PCT/US2015/010554, mailed on Apr. 21, 2015.
(Continued)

*Primary Examiner* — Humera N. Sheikh
*Assistant Examiner* — Elizabeth D Ivey
(74) *Attorney, Agent, or Firm* — Carlson, Gaskey & Olds, P.C.

(57) ABSTRACT

An article includes a silicon oxycarbide-based layer that has Si, O, and C in a covalently bonded network. The silicon oxycarbide-based layer has first and second opposed surfaces. A calcium-magnesium alumino-silicate-based layer is interfaced with the first surface of the silicon oxycarbide-based layer.

19 Claims, 1 Drawing Sheet

Related U.S. Application Data

(60) Provisional application No. 61/927,079, filed on Jan. 14, 2014.

(51) Int. Cl.
*C23C 4/12* (2016.01)
*C23C 16/32* (2006.01)
*C23C 16/40* (2006.01)
*C23C 28/04* (2006.01)
*F16J 15/453* (2006.01)

(52) U.S. Cl.
CPC ...... *F05D 2240/30* (2013.01); *F05D 2240/35* (2013.01); *F05D 2300/21* (2013.01); *F05D 2300/211* (2013.01); *F05D 2300/2261* (2013.01); *F05D 2300/611* (2013.01)

(56) References Cited

U.S. PATENT DOCUMENTS

| | | | |
|---|---|---|---|
| 6,902,836 B2 | 6/2005 | Eaton et al. | |
| 7,951,459 B2 | 5/2011 | Tang et al. | |
| 8,039,113 B2 | 10/2011 | Kirby et al. | |
| 8,273,470 B2 | 9/2012 | Kirby et al. | |
| 2007/0036997 A1* | 2/2007 | Floyd | C23C 28/3215 428/471 |
| 2009/0184280 A1 | 7/2009 | Lee | |
| 2009/0324930 A1 | 12/2009 | Tulyani et al. | |
| 2010/0154422 A1 | 6/2010 | Kirby et al. | |
| 2010/0158680 A1 | 6/2010 | Kirby et al. | |
| 2012/0034491 A1* | 2/2012 | Hongoh | C23C 28/345 427/446 |
| 2012/0308842 A1* | 12/2012 | Schmidt | C04B 41/52 428/614 |
| 2012/0328886 A1* | 12/2012 | Schmidt | C04B 41/89 428/428 |
| 2013/0183531 A1* | 7/2013 | Schmidt | C04B 35/5603 428/428 |

OTHER PUBLICATIONS

U.S. Appl. No. 13/603,891, filed Sep. 5, 2012.
U.S. Appl. No. 13/167,425, filed Jun. 23, 2011.
U.S. Appl. No. 13/352,636, filed Jan. 18, 2012.
Walter, S., Suttor, D., Erny, T., Hahn, B., and Greil, P. (1995). Injection moulding of polysiloxane/filler mixtures for oxycarbide ceramic composites. Journal of European Ceramic Society 16 (1996) 387-393.
Renlund, G.M., Prochazka, S. (1990). Silicon oxycarbide glasses: Preparation and chemistry. J. Mater. Res. vol. 6, No. 12, Dec. 1991.
Tyczkowski, J. and Delamar, M. Ultraviolet luminescence of Gd-doped a-$Si_xC_yO_z$: H films fabricated by plasma chemical vapor deposition. Materials Science and Engineering, 146 (2008) 151-156.
Extended European Search Report for European Patent Application No. 15737244.2 completed Aug. 3, 2017.

* cited by examiner

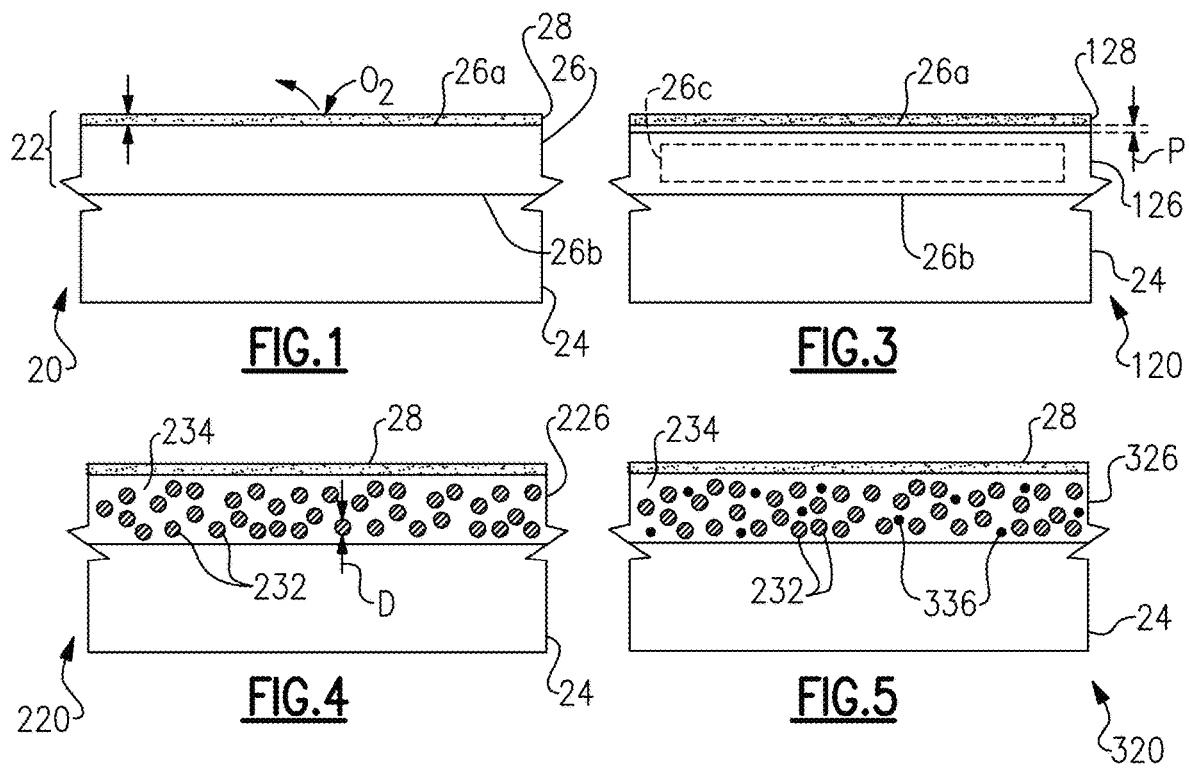
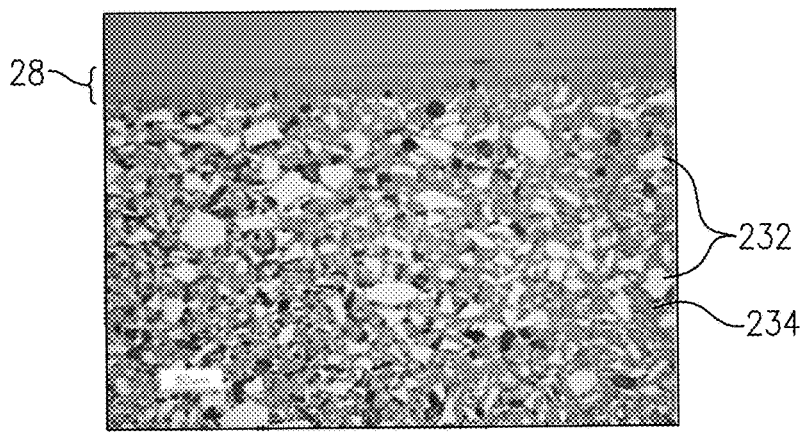
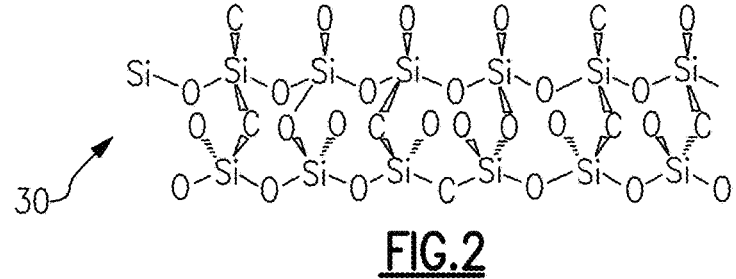

SILICON OXYCARBIDE-BASED ENVIRONMENTAL BARRIER COATING

CROSS-REFERENCE TO RELATED APPLICATIONS

This application is a continuation of U.S. patent application Ser. No. 15/110,819 filed Jul. 11, 2016; which is a National Phase of International Application No. PCT/US2015/010554 filed Jan. 8, 2015; which claims priority to U.S. Provisional Application No. 61/927,079, filed Jan. 14, 2014.

STATEMENT REGARDING FEDERALLY SPONSORED RESEARCH OR DEVELOPMENT

This invention was made with government support under contract number N00014-09-C-0201 awarded by the United States Navy. The government has certain rights in the invention.

BACKGROUND

This disclosure relates to composite articles, such as those used in gas turbine engines.

Components, such as gas turbine engine components, may be subjected to high temperatures, corrosive and oxidative conditions, and elevated stress levels. In order to improve the thermal and/or oxidative stability, the component may include a protective ceramic barrier coating.

SUMMARY

An article according to an example of the present disclosure includes a silicon oxycarbide-based layer having Si, O, and C in a covalently bonded network, the silicon oxycarbide-based layer having first and second opposed surfaces, and a calcium-magnesium alumino-silicate-based layer interfaced with the first surface of the silicon oxycarbide-based layer.

In a further embodiment of any of the foregoing embodiments, the silicon oxycarbide-based layer further includes $SiO_2$.

In a further embodiment of any of the foregoing embodiments, the silicon oxycarbide-based layer includes, by volume, 5-65% of the $SiO_2$ with a remainder of silicon oxycarbide.

In a further embodiment of any of the foregoing embodiments, the $SiO_2$ is a continuous matrix phase with regions of the silicon oxycarbide dispersed there through.

In a further embodiment of any of the foregoing embodiments, the silicon oxycarbide-based layer further includes a dispersed phase of barium-magnesium alumino-silicate.

In a further embodiment of any of the foregoing embodiments, the silicon oxycarbide-based layer includes, by volume, 1-30% of the dispersed phase of barium-magnesium alumino-silicate.

In a further embodiment of any of the foregoing embodiments, the silicon oxycarbide-based layer further includes a continuous matrix phase of $SiO_2$ and a dispersed phase of barium-magnesium alumino-silicate.

In a further embodiment of any of the foregoing embodiments, the silicon oxycarbide-based layer further includes a continuous matrix phase of barium-magnesium alumino-silicate and a dispersed phase of $SiO_2$.

In a further embodiment of any of the foregoing embodiments, the silicon oxycarbide-based layer further includes a continuous matrix phase of $SiO_2$ or barium-magnesium alumino-silicate, the silicon oxycarbide-based layer including, by volume, 5-65% of the continuous matrix phase, and 1-30% of a dispersed phase of the other of the $SiO_2$ or barium-magnesium alumino-silicate, with a remainder of silicon oxycarbide.

In a further embodiment of any of the foregoing embodiments, the calcium-magnesium alumino-silicate-based layer partially penetrates into the silicon oxycarbide-based layer such that at least a central core of the silicon oxycarbide-based layer is free of calcium-magnesium alumino-silicate-based material.

In a further embodiment of any of the foregoing embodiments, the silicon oxycarbide-based layer has a composition $SiO_xM_zC_y$, where M is at least one metal, $x<2$, $y>0$ and $z<1$ and x and z are non-zero.

In a further embodiment of any of the foregoing embodiments, the silicon oxycarbide-based layer is thicker than the calcium-magnesium alumino-silicate-based layer.

In a further embodiment of any of the foregoing embodiments, the calcium-magnesium alumino-silicate-based layer has an average thickness of 1 micrometer to 3 millimeters.

In a further embodiment of any of the foregoing embodiments, the silicon oxycarbide-based layer includes discrete regions of silicon oxycarbide-based material, the discrete regions having an average maximum dimension of 1-75 micrometers.

In a further embodiment of any of the foregoing embodiments, the calcium-magnesium alumino-silicate-based layer sealing the silicon oxycarbide-based layer from oxygen diffusion and steam recession into the silicon oxycarbide-based layer.

A composite according to an example of the present disclosure includes a silicon oxycarbide-based material having Si, O, and C in a covalently bonded network, the silicon oxycarbide-based material having a surface, and a calcium-magnesium alumino-silicate-based material interfaced with the surface of the silicon oxycarbide-based material.

In a further embodiment of any of the foregoing embodiments, the silicon oxycarbide-based material further includes a dispersed phase of barium-magnesium alumino-silicate.

In a further embodiment of any of the foregoing embodiments, the silicon oxycarbide-based material includes, by volume, 1-30% of the dispersed phase of barium-magnesium alumino-silicate.

In a further embodiment of any of the foregoing embodiments, the silicon oxycarbide-based material further includes a continuous matrix phase of $SiO_2$ or barium-magnesium alumino-silicate, and a dispersed phase of the other of barium-magnesium alumino-silicate or $SiO_2$.

In a further embodiment of any of the foregoing embodiments, the silicon oxycarbide-based material has a composition $SiO_xM_zC_y$, where M is at least one metal, $x<2$, $y>0$ and $z<1$ and x and z are non-zero.

BRIEF DESCRIPTION OF THE DRAWINGS

The various features and advantages of the present disclosure will become apparent to those skilled in the art from the following detailed description. The drawings that accompany the detailed description can be briefly described as follows.

FIG. 1 illustrates a portion of an example article that includes a silicon oxycarbide-based layer and a calcium-magnesium alumino-silicate-based layer.

FIG. 2 illustrates a covalently bonded network of Si, O, and C atoms.

FIG. 3 illustrates a portion of another example article that includes a silicon oxycarbide-based layer and a calcium-magnesium alumino-silicate-based layer.

FIG. 4 illustrates a portion of another example article that includes a silicon oxycarbide-based layer and a calcium-magnesium alumino-silicate-based layer.

FIG. 5 illustrates a portion of another example article that includes a silicon oxycarbide-based layer and a calcium-magnesium alumino-silicate-based layer.

FIG. 6 illustrates a micrograph of a silicon oxycarbide-based layer and a calcium-magnesium alumino-silicate-based layer.

DETAILED DESCRIPTION

FIG. 1 schematically illustrates a representative portion of an example article 20 that includes a composite material 22. The article 20 can be a gas turbine engine component, such as but not limited to an airfoil, a combustor liner panel, a blade outer air seal, or other component that would benefit therefrom. In this example, the composite material 22 is used as an environmental barrier coating system to protect an underlying substrate 24 from environmental conditions, as well as thermal conditions. As will be appreciated, the composite material 22 of the coating system can be used as a stand-alone environmental barrier coating, as an outermost/topcoat with additional underlying layers, or in combination with other coatings, such as, but not limited to, ceramic thermal barrier coatings.

In this example, the composite material 22 of the article 20 includes a silicon oxycarbide-based layer 26 that extends between first and second opposed surfaces 26a/26b and a calcium-magnesium alumino-silicate-based layer 28 interfaced with the first surface 26a of the silicon oxycarbide-based layer 26. The calcium-magnesium alumino-silicate-based layer 28 can be deposited using known coating deposition techniques, such as but not limited to thermal spraying. In other examples, at least a portion of the calcium-magnesium alumino-silicate-based layer 28 can be deposited in-situ during use of the article 20, with purposeful exposure to calcium-, magnesium-, aluminum-, and silicon-containing materials at temperatures that can cause at least partial liquefaction and wetting to a coating with at least partial adhesion to the underlying layer.

As shown in the example in FIG. 2, the silicon oxycarbide-based layer 26 has Si, O, and C atoms in a covalently bonded network 30. The network 30 is amorphous and thus does not have long range crystalline structure. The illustrated network 30 is merely one example in which at least a portion of the silicon atoms are bonded to both O atoms and C atoms. As can be appreciated, the bonding of the network 30 will vary depending upon the atomic ratios of the Si, C, and O. In one example, the silicon oxycarbide-based layer 26 has a composition $SiO_xM_zC_y$, where M is at least one metal, x is less than two, y is greater than zero, z is less than one, and x and z are non-zero. The metal can include aluminum, boron, transition metals, refractory metals, rare earth metals, alkaline earth metals or combinations thereof.

While calcium-magnesium alumino-silicate material is normally expected to debit the durability of ceramic thermal barrier coatings, the calcium-magnesium alumino-silicate based layer 28 serves in the composite material 22 to seal the silicon oxycarbide-based layer 26 with respect to the combustion environment, including oxygen and steam, thus protecting the chemical composition of the silicon oxycarbide-based layer 26 and the underlying substrate 24 from oxidative attack and steam recession. In this regard, the calcium-magnesium alumino-silicate-based layer 28 in one example can have average thickness of 1 micrometer to 3 millimeters, with a preferred range of 1-254 micrometers, to provide a sealing functionality. In some examples, the calcium-magnesium alumino-silicate-based layer 28 can protect the silicon oxycarbide-based layer 26 and underlying substrate 24 from oxidation and steam attack at temperatures of up to about 2700° F. (1482° C.), and potentially greater than 3000° F. (1648° C.). In this case, although calcium-magnesium alumino-silicate material typically normally serves to destroy thermal barrier coatings, the composition of the silicon oxycarbide-based layer 26 is not readily infiltrated by the calcium-magnesium alumino-silicate material and, at high temperatures, the material does not substantially penetrate into the silicon oxycarbide-based layer 26.

FIG. 3 illustrates another example article 120 that is similar to the article 20 of FIG. 1 with the exception that a calcium-magnesium alumino-silicate based layer 128 penetrates partially, as represented at P, into the silicon oxycarbide-based layer 26. At least a central core 26c of the silicon oxycarbide-based layer 26 is free of calcium-magnesium alumino-silicate-based material. In this example, the penetration of the calcium-magnesium alumino-silicate material partially into the silicon oxycarbide-based layer 26 can occur at elevated temperatures at which the calcium-magnesium alumino-silicate material may soften or liquefy and penetrate into macro- or micro-pores of the silicon oxycarbide-based layer 26. However, due to the similar chemistry between the calcium-magnesium alumino-silicate based layer 128 and the silicon oxycarbide-based layer 26, the driving force for diffusion is relatively low. The thermomechanical behavior between the calcium-magnesium alumino-silicate based layer 128 and the silicon oxycarbide-based layer 26 is also similar because of the similar chemistry, thus reducing thermal expansion mismatches that could otherwise serve to initiate and propagate cracks.

FIG. 4 illustrates another example article 220 that includes a silicon oxycarbide-based layer 226. In this example, the article 220 is somewhat similar to the article 20 of FIG. 1, with the exception that the silicon oxycarbide-based layer 226 includes discrete regions 232 of silicon oxycarbide-based material that is dispersed within a continuous matrix phase 234. For example, the continuous matrix phase 234 is silicon dioxide ($SiO_2$) or barium-magnesium alumino-silicate. In one example, the silicon oxycarbide-based layer 226 includes, by volume, 40% of the silicon dioxide or barium-magnesium alumino-silicate, with a remainder of silicon oxycarbide, and the discrete regions 232 of silicon oxycarbide-based material have an average maximum dimension, represented at D, of 75 micrometers or less, which facilitates blocking the diffusion of oxygen. In one further example, the continuous matrix phase 234 is the barium-magnesium alumino-silicate and there is also a dispersed phase of $SiO_2$.

FIG. 5 illustrates another example article 320 that is somewhat similar to the article 220 of FIG. 4 with the exception that a silicon oxycarbide-based layer 326 additionally includes a dispersed phase of barium-magnesium alumino-silicate 336. In one example, the silicon oxycarbide-based layer 326 includes, by volume, 25% of the silicon dioxide, 4% of the dispersed phase of barium-magnesium alumino-silicate 336 and a remainder of silicon oxycarbide.

FIG. 6 shows an example micrograph of the composite material. In this example, the composite material includes regions of the silicon oxycarbide 232 dispersed through a continuous or semi-continuous matrix phase of silicon dioxide 234, with the calcium-magnesium alumino-silicate-based layer 28 interfaced with the surface of the silicon oxycarbide-based material.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. An article comprising:
a silicon oxycarbide-based layer having Si, O, and C in a covalently bonded network, the silicon oxycarbide-based layer having first and second opposed surfaces and being composed of a continuous matrix phase of either $SiO_2$ or barium-magnesium alumino-silicate, dispersed regions of silicon oxycarbide within the continuous matrix phase, and dispersed regions of the other of the $SiO_2$ or that barium-magnesium alumino-silicate within the continuous matrix phase, wherein the silicon oxycarbide-based layer has a composition $SiO_xM_zC_y$, where M is at least one metal selected from the group of aluminum, boron, transition metals, refractory metals, rare earth metals, and alkaline earth metals, $x<2$, $y>0$ and $z<1$ and x and z are non-zero; and
a calcium-magnesium alumino-silicate-based layer interfaced with the first surface of the silicon oxycarbide-based layer, wherein the calcium-magnesium alumino-silicate-based layer partially penetrates into pores of the silicon oxycarbide-based layer in a liquid state such that at least a central core of the silicon oxycarbide-based layer is free of calcium-magnesium alumino-silicate-based material, wherein the silicon oxycarbide-based layer is thicker than the calcium-magnesium alumino-silicate-based layer.

2. The article as recited in claim 1, wherein the silicon oxycarbide-based layer includes, by volume, 5-65% of the $SiO_2$.

3. The article as recited in claim 1, wherein the $SiO_2$ is a continuous matrix phase with regions of the silicon oxycarbide dispersed there through.

4. The article as recited in claim 1, wherein the silicon oxycarbide-based layer further includes a dispersed phase of barium-magnesium alumino-silicate.

5. The article as recited in claim 4, wherein the silicon oxycarbide-based layer includes, by volume, 1-30% of the dispersed phase of barium-magnesium alumino-silicate.

6. The article as recited in claim 1, wherein the silicon oxycarbide-based layer a continuous matrix phase of $SiO_2$ and a dispersed phase of barium-magnesium alumino-silicate.

7. The article as recited in claim 1, wherein the silicon oxycarbide-based layer includes a continuous matrix phase of barium-magnesium alumino-silicate and a dispersed phase of $SiO_2$.

8. The article as recited in claim 1, wherein the silicon oxycarbide-based layer includes, by volume, 5-65% of the continuous matrix phase, and 1-30% of a dispersed phase of the other of the $SiO_2$ or barium-magnesium alumino-silicate, with a remainder of silicon oxycarbide.

9. The article as recited in claim 1, wherein the calcium-magnesium alumino-silicate-based layer has an average thickness of 1 micrometer to 3 millimeters.

10. The article as recited in claim 1, wherein the silicon oxycarbide-based layer includes discrete regions of silicon oxycarbide-based material, the discrete regions having an average maximum dimension of 1-75 micrometers.

11. The article as recited in claim 1, the calcium-magnesium alumino-silicate-based layer sealing the silicon oxycarbide-based layer from oxygen diffusion and steam recession into the silicon oxycarbide-based layer.

12. The article as recited in claim 1, wherein the metal is a refractory metal.

13. The article as recited in claim 1, wherein the metal is a rare earth metal.

14. The article as recited in claim 1, wherein the metal is a transition metal.

15. The article as recited in claim 1, wherein the metal is an alkaline earth metal.

16. A composite comprising:
a silicon oxycarbide-based material having Si, O, and C in a covalently bonded network, the silicon oxycarbide-based material having a surface and being composed of a continuous matrix phase of either $SiO_2$ or barium-magnesium alumino-silicate, dispersed regions of silicon oxycarbide within the continuous matrix phase, and dispersed regions of the other of the $SiO_2$ or that barium-magnesium alumino-silicate within the continuous matrix phase, wherein the silicon oxycarbide-based layer has a composition $SiO_xM_zC_y$, where M is at least one metal selected from the group of aluminum, boron, transition metals, refractory metals, rare earth metals, and alkaline earth metals, $x<2$, $y>0$ and $z<1$ and x and z are non-zero; and
a calcium-magnesium alumino-silicate-based material interfaced with the surface of the silicon oxycarbide-based material, wherein the calcium-magnesium alumino-silicate-based layer partially penetrates into pores of the silicon oxycarbide-based layer in a liquid state such that at least a central core of the silicon oxycarbide-based layer is free of calcium-magnesium alumino-silicate-based material, wherein the silicon oxycarbide-based layer is thicker than the calcium-magnesium alumino-silicate-based layer.

17. The composite as recited in claim 16, wherein the silicon oxycarbide-based material includes a dispersed phase of barium-magnesium alumino-silicate.

18. The composite as recited in claim 17, wherein the silicon oxycarbide-based material includes, by volume, 1-30% of the dispersed phase of barium-magnesium alumino-silicate.

19. The composite as recited in claim 16, wherein the silicon oxycarbide-based material includes a continuous matrix phase of $SiO_2$ or barium-magnesium alumino-silicate, and a dispersed phase of the other of barium-magnesium alumino-silicate or $SiO_2$.

* * * * *